(12) United States Patent
Nguyen

(10) Patent No.: US 6,396,743 B1
(45) Date of Patent: May 28, 2002

(54) CONTROL CIRCUIT FOR A NON-VOLATILE MEMORY ARRAY FOR CONTROLLING THE RAMP RATE OF HIGH VOLTAGE APPLIED TO THE MEMORY CELLS AND TO LIMIT THE CURRENT DRAWN THEREFROM

(75) Inventor: Tam Nguyen, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/860,706

(22) Filed: May 18, 2001

(51) Int. Cl.⁷ .............................................. G11C 16/06
(52) U.S. Cl. ........................... 365/185.23; 365/185.05; 365/185.12; 365/185.18
(58) Field of Search ................. 365/185.23, 185.18, 365/185.19, 185.11, 185.12, 185.17, 185.05, 189.09

(56) References Cited

U.S. PATENT DOCUMENTS 5,920,505 A  *  7/1999  Sali et al. ............... 365/185.18
6,128,230 A  * 10/2000  Amanai .................. 365/185.23
6,236,594 B1 *  5/2001  Kwon .................... 365/185.11

* cited by examiner

Primary Examiner—David Nelms
Assistant Examiner—Gene N. Auduong
(74) Attorney, Agent, or Firm—Gray Cary Ware & Freidenrich LLP

(57) ABSTRACT

A control circuit for a non-volatile memory array having a plurality of sectors, comprises a plurality of mirror circuits connected in parallel. Each mirror circuit comprises a first transistor and a common transistor. The common transistor is common to all of the mirror circuits connected to all of the sectors. A charge pump supplies voltage to the node that connects between the first transistor and the mirror transistor. A current limiter circuit limits the amount of current flowing through the common transistor. The control circuit limits the amount of current that can flow through a defective sector and controls the rate at which voltage from the charge pump is supplied to each of the sectors.

18 Claims, 2 Drawing Sheets

CONTROL CIRCUIT FOR A NON-VOLATILE MEMORY ARRAY FOR CONTROLLING THE RAMP RATE OF HIGH VOLTAGE APPLIED TO THE MEMORY CELLS AND TO LIMIT THE CURRENT DRAWN THEREFROM

TECHNICAL FIELD

The present invention relates a method and apparatus for controlling the ramp rate at which a high voltage from a charge pump of a non-volatile memory array device supplies the increased voltage to sectors of the non-volatile memory array. The present invention also relates to a method and apparatus for limiting the amount of current supplied to each sector of non-volatile memory cells in the event one or more cells in a sector are defective.

BACKGROUND OF THE INVENTION

Non-volatile memory arrays using memory cells having floating gate to store charges thereon to control the flow of current in a channel beneath the floating gate are well known in the art. Typically, because the memory cell is programmed or erased by subjecting the electrons to a high voltage, an onboard high voltage pump is needed. However, a high voltage pump has a limited amount of current-carrying capacity.

Heretofore, it is also well known to divide a non-volatile memory array into a plurality of sectors of memory cells. Each sector comprises a plurality of memory cells arranged, typically, in one or more rows with a word line in a row connecting the control gates of the memory cells. However, it is not intended by this invention to limit to those memory arrays of the type wherein a word line connects the control gates of the memory cells in the same row line. It is also well known to provide redundant sectors of memory cells. Thus, in the event a sector of memory cells is or becomes defective, a spare or redundant sector of memory cells is used in place of the defective memory cells. Typically, a failure condition results in the memory incapable of storing charges caused by a "short". This means that if a high voltage were applied to the memory cells of the defective sector, a short occurs and a large amount of current would flow through the defective memory cell(s) of the sector. This clearly is undesirable because there would not be enough current from the charge pump to operate the other sectors and the redundant sectors which are placed into operation, because typically a charge pump boosts the voltage supplied externally to the chip and generates an internal high voltage, which is current limited.

Referring to FIG. 1 there is shown a block level diagram of a non-volatile memory device 10 of the prior art to which the control circuit of the present invention may be used. The non-volatile memory device 10 comprises an array 12 of non-volatile memory cells, divided into a plurality of sectors, designated as S1, S2 ... Sn, each having a word line connected thereto. A row decoder 18 and a column decoder 16 receive address signals from an address bus (not shown) and decode the signals and access the particular memory cell(s) from the array 12. A sense amplifier 20 receives signals from the array 12, and provides the output from the device 10. Finally, a high voltage charge pump 14 generate a high voltage which is supplied to each sector, S1, S2, ... Sn, through its respective word line.

In the prior art, it is also known to provide circuitry to limit the current flow into each sector thereby assuring that even if a sector had defective memory cells, the shortage created thereby would not draw an overwhelming large amount of current from the charge pump. Referring to FIG. 2, there is shown a prior art control circuit 30 interposed between the high voltage charge pump 14 and the word line of each sector. As can be seen, the control circuit 30 of the prior art required a large number of transistors. Such transistors take up valuable real estate in the integrated circuit memory array. Accordingly, it is desirable to reduce the number of transistors in such a control circuit 30 while at the same time performing the desirable function of limiting the current flowing into a defective sector.

SUMMARY OF THE INVENTION

Accordingly, in the present invention, a control circuit for a non-volatile memory array distributes a first voltage to a plurality of sectors with each sector having a plurality of non-volatile memory cells connected by a line. The control circuit has a plurality of first transistors with each transistor having a first terminal, a second terminal and a channel therebetween, and a gate for controlling the flow of the current between the first and second terminals. The first terminal of each first transistor is connected to the line of a different sector. The second terminals of the plurality of first transistors are all connected together to receive the first voltage. A second transistor has a first terminal, a second terminal and a channel therebetween and a gate for controlling the flow of current between the first and second terminals. The first terminal of the second transistor is connected to the second terminals of the plurality of first transistors. The gate of the plurality of first transistors and the gate of the second transistor are connected together and to the second terminal of the second transistor. A current limiter circuit is connected to the second terminal of the second transistor for limiting the current supply to the plurality of sectors.

The present invention also relates to a distribution circuit which control the rate of the voltage supplied to each sector depending upon the capacitance within the sector, the voltage from the charge pump, the width to length ratio of the first and second transistors and the current from the current limiter.

DETAILED DESCRIPTION OF THE INVENTION

Figure 1:
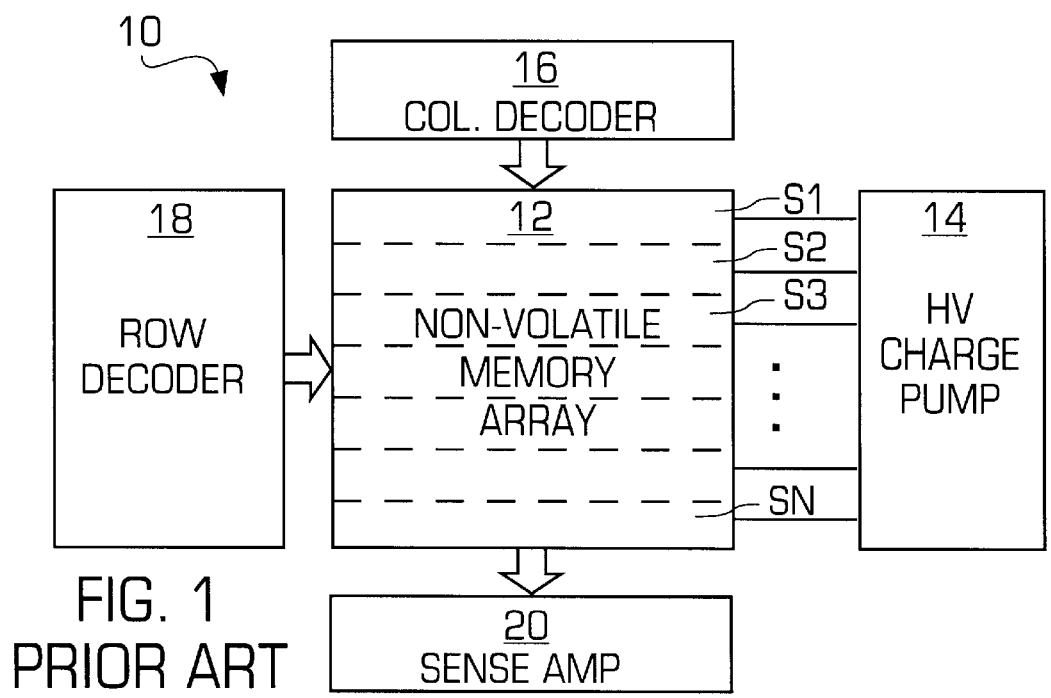
FIG. 1 is a block level diagram of a non-volatile memory array integrated circuit device of the prior art in which the control circuit of the present invention can be used.
Figure 3:
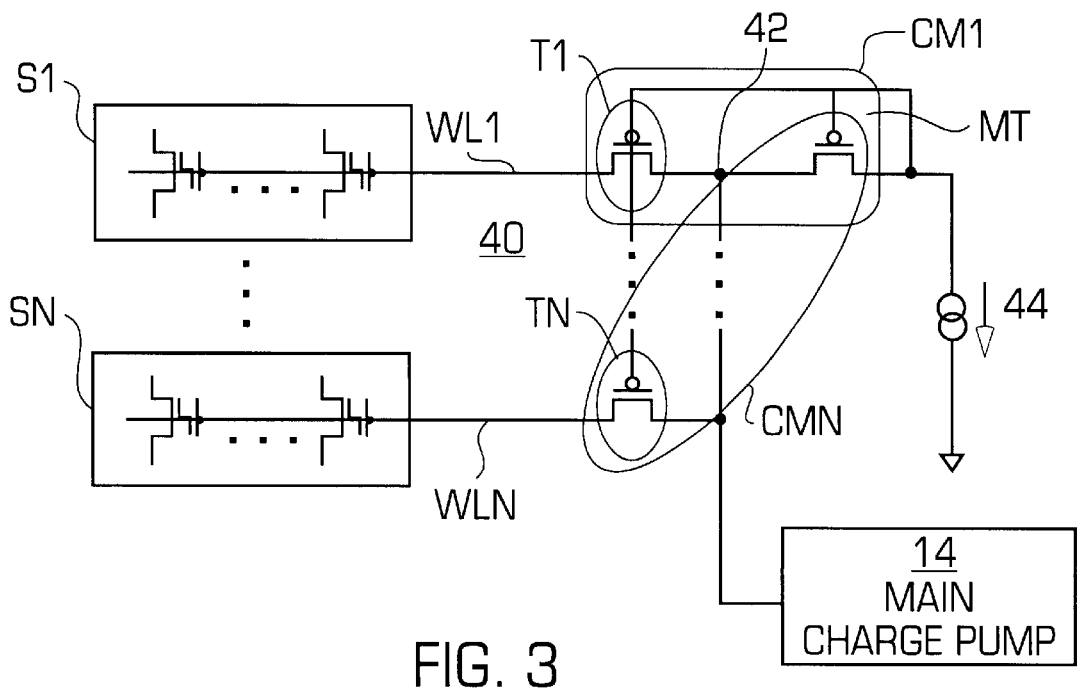
FIG. 3 is a detailed circuit diagram of the control circuit of the present invention.
Figure 2:
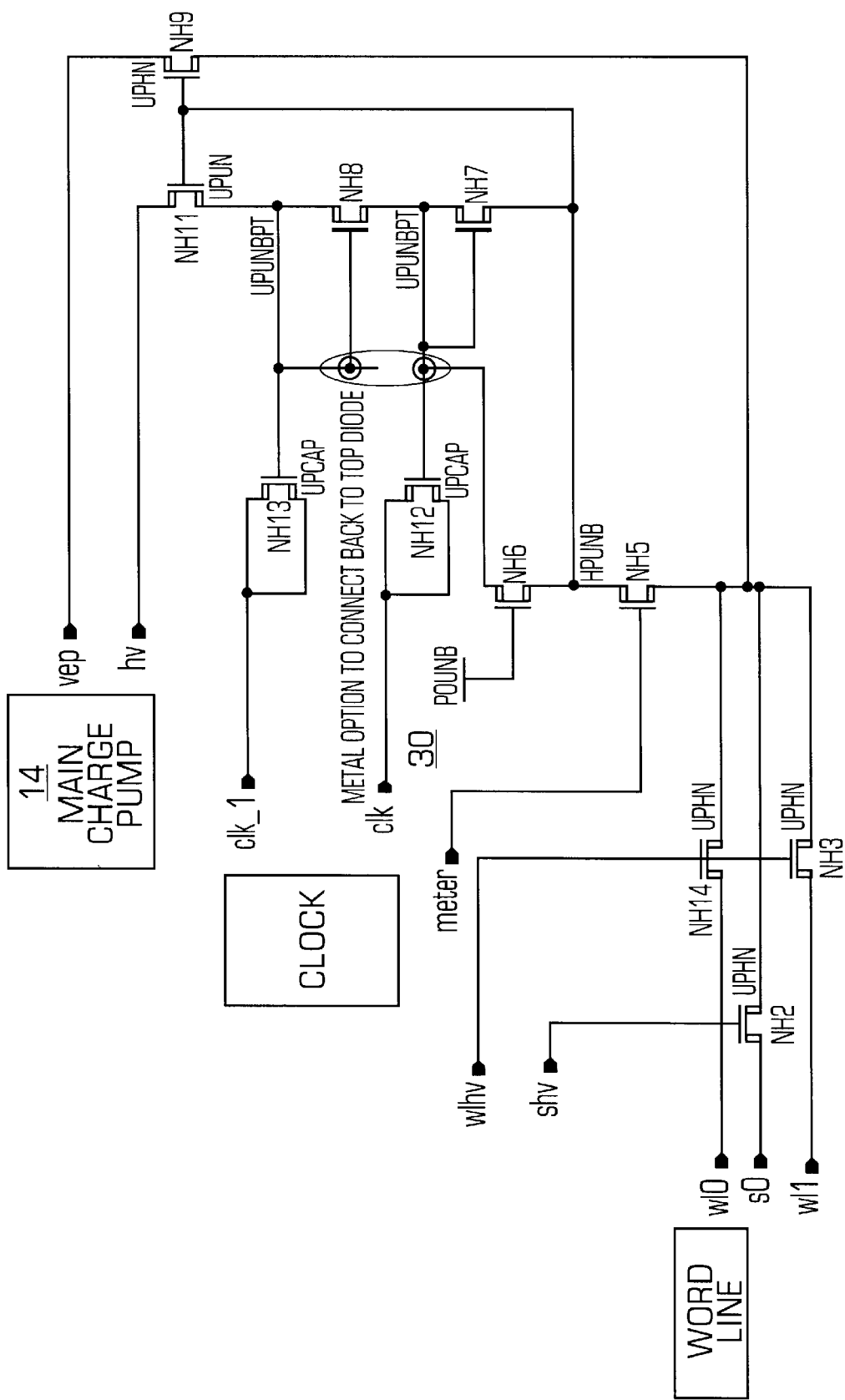
FIG. 2 is a detailed circuit diagram of a control-circuit of the prior art.

Referring to FIG. 3, there is shown a schematic circuit diagram of a control circuit 40 of the present invention. The control circuit 40 is connected to a plurality of sectors (S1 ... SN) of non-volatile memory cells. Within each sector, e.g. S1, is a plurality of non-volatile memory cells of the type such as that disclosed in U.S. Pat. No. 5,572,054 whose disclosure is incorporated herein by reference in its entirety. Each of the memory cells in each of the sectors, e.g. sector S1, has a control gate with a word line, WL1, connecting the control gates of all the memory cells in the same sector arranged in the same row. It should be notes, however, that although the invention is described with regard to the control 40 circuit connecting to the word lines WL of each of the sectors S, the invention is not so limited. The word line is chosen because that is the line which connects all of the cells in the sector of the type shown and disclosed in U.S. Pat. No. 5,572,054 to which a high voltage from a charge pump is supplied. It is contemplated to be within the scope of the present invention, that the control circuit 40 can be connected to any line connecting all of the memory cells in common in the same sector which receive the high voltage.

For each sector, e.g. S1, of memory cells, the control circuit 40 comprises a current mirror circuit which comprises a pair of current mirror transistors, e.g. a first transistor T1, and a common transistor MT. The first transistor T1, as is well known, has a first and a second region with a channel therebetween and a gate for controlling the flow of current between the first and second terminals through the channel. In the preferred embodiment, the first transistor T1 is a PMOS type transistor. The first terminal is connected to the word line WL1 of the sector to which the first transistor T1 is associated with. The second terminal is connected to a common node 42. The common transistor MT also has a first and a second terminal with a channel therebetween and a gate for controlling the flow of current between the first and second terminals. Similar to the first transistor t1, in the preferred embodiment, the common transistor MT is of PMOS type. The first terminal of the common transistor MT is connected to the common node 42. The second terminal of the common transistor MT is connected to the gate of the common transistor MT and to the gate of the first transistor T1. A current source 44 limiting the current flowing through the common transistor MT is connected to the second terminal of the common transistor MT. The output of the high voltage charge pump 14 is connected to the common node 42. The charge pump 14 can be of conventional design serving to generate a high voltage by boosting the voltage supplied from the external to the chip.

Each of the sectors, e.g. S2, has its own associated current mirror circuit comprising a first transistor, e.g. T2, connected to the word line of the sector and to the common node 42 and the common transistor MT. Thus, all of the current mirror circuits are connected in parallel.

There are many advantages to the control circuit 40 of the present invention. First and foremost, if a sector, e.g. sector S1, should fail, and if it should fail in a mode such that it causes a short in the conduction of one or more memory cell(s) within the sector, there would be a current drain along the associated word line WL1. However, because a current mirror circuit is connected to the word line WL1, the amount of current that can be drained due to the short within the sector S1 is limited. A redundant sector of memory cells can then be placed into the circuit to replace the memory cells of the sector S1. If S1 is defective, the maximum current drain into the sector S1 is limited by the current drain flowing through the transistor MT. This is mirrored and limited by transistor T1. Thus, transistor T1 limits the amount of current supplied through the defective sector S1.

Another advantage of the control circuit 40 of the present invention is that it can control the rate of high voltage from the charge pump 14 that is supplied to each of the sectors. Due to the presence of non-volatile memory cells, each sector inherently has a capacitance C. The voltage from the charge pump 14 is designated V. Each of first the transistors T1 ... TN, in the preferred embodiment, are substantially identical and have a width to length ratio of m. Further, the single common transistor MT has a width to length ratio of M. The current limiter circuit 44 limits the total current I flowing therethrough. In that event, the rate at which the high voltage V from the charge pump 14 is supplied to each of the sectors is determined in accordance with $$t_{sec} = \frac{c * V * \frac{M}{m}}{I} \text{(sec)}; \text{rate} = \frac{V}{t} = \frac{I}{c\frac{M}{m}} \text{(volt/sec)}$$

Therefore, by choosing the width to length ratio of each of the first transistors T1 ... TN and the width to length ratio of the mirror transistor MT, the rate of the voltage V supplied from the charge pump 14 to sectors can be controlled.

As can be seen from the foregoing, control circuit 40 of the present invention is far simpler than the control or distribution circuit 30 of the prior art. There are far fewer transistors resulting in savings in real estate on the silicon chip. Further, the control circuit 40 can control not only the amount of current flowing through a defective sector, but also has the added benefit of controlling the rate at which voltage from the charge pump is supplied to each of the sectors.

What is claimed is:

1. A control circuit for a non-volatile memory array having a plurality of sectors, each sector having a plurality of non-volatile memory cells connected by a line, said control circuit for receiving a first voltage (V) and for distributing said first voltage to said plurality of sectors, said circuit comprising:

a plurality of first transistors each first transistor having a first terminal, a second terminal and a channel therebetween, and a gate for controlling the flow of current between said first and second terminals; wherein the first terminal of each first transistor is connected to the line of a different sector; the second terminals of said plurality of first transistors are connected together to receive the first voltage;

a second transistor having a first terminal, a second terminal, and a channel therebetween, and a gate for controlling the flow of current between said first and second terminals; wherein the first terminal of said second transistor is connected to said second terminals of said plurality of first transistors; said gate of said plurality of first transistors and said gate of said second transistor are connected together and to said second terminal of said second transistor; and a current limiter circuit connected to said second terminal of said second transistor for limiting the current (I) supplied to said sectors.

2. The control circuit of claim 1 wherein each sector has a capacitance (c).

3. The control circuit of claim 2 wherein each of said plurality of first transistors is substantially the same having a width to length ration of m.

4. The control circuit of claim 3 wherein said second transistor has a width to length ratio of M.

5. The control circuit of claim 4 wherein said control circuit controls the rate at which the first voltage V is supplied to each sector in accordance $$\text{time} = \frac{c * V * \frac{M}{m}}{I} \text{(sec)}; \text{rate} = \frac{I}{c\frac{M}{m}} \text{(volt/sec)}.$$

6. The control circuit of claim 1 for limiting the maximum amount of current supplied to each sector.

7. The control circuit of claim 1 wherein each of said plurality of first transistors is a PMOS type transistor, and wherein said second transistor is a PMOS type transistor.

8. A distribution circuit for use with a charge pump in a non-volatile memory device having an array of non-volatile memory cells arranged in a plurality of sectors; said circuit comprising:

a plurality of substantially identical current mirror circuits, each current mirror circuit having a first section and a second section with said second section mirroring the current flow in said first section;

said plurality of current mirror circuits connected in parallel with each first section of a current mirror circuit connected to a different sector of said array of non-volatile memory cells; with said plurality of current mirror circuits having the same second section;

a current source connected to said same second section; and said charge pump connected to a node between said first section and said same second section of each current mirror circuit.

9. The distribution circuit of claim 8 wherein each first section comprises:

a first transistor having a first terminal, a second terminal, and a channel therebetween, and a gate for controlling the flow of current between said first terminal and said second terminal, said first terminal connected to said sector and said second terminal connected to said same second section.

10. The distribution circuit of claim 9 wherein each sector further comprises a word line, each non-volatile memory cell having a control gate with said word line connecting the control gates of all the memory cells in said sector.

11. The distribution circuit of claim 10 wherein said first terminal is connected to said word line.

12. The distribution circuit of claim 9 wherein said same second section further comprises:

a second transistor having a first terminal, a second terminal and a channel therebetween, and a gate for controlling the flow of current between said first terminal and said second terminal, said second terminal connected to said current source and to said gates of said first and second transistors, said first terminal connected to said charge pump.

13. The distribution circuit of claim 12 wherein said first transistor is a PMOS type and said second transistor is a PMOS type.

14. A method of controlling current to a non-volatile memory array having a plurality of sectors; said method comprising the step of:

providing a plurality of current mirror circuits; each current mirror circuit connected to a sector and having a first section and a common second section both connected to a node, with said plurality of current mirror circuits connected in parallel;

providing a current limiting circuit to said common second section; and supplying a high voltage to said node.

15. The method of claim 14 further comprising the steps of:

boosting a voltage by a charge pump to said high voltage.

16. A method of controlling the rate of voltage (v) supplied to a group of circuits in an integrated circuit device, said group of circuits having a capacitance (c), said method comprising:

connecting a current mirror circuit to said group; said current mirror circuit having a first transistor having a width to length ration of m, connected at a node to a second transistor having a width to length ration of M;

connecting a current limiter circuit to said second transistor, said current limiter circuit for limiting the amount of current (I) flowing therethrough;

supplying said voltage (v) to said node;

wherein said rate is determined by.

$$\text{time} = \frac{c * V * \frac{M}{m}}{I} (\text{sec}); \text{rate} = \frac{I}{\frac{M}{c}} (\text{volt/sec}).$$

17. The method of claim 16 wherein said group of circuits is a sector of non-volatile memory cells.

18. The method of claim 17 further comprising the step of:

boosting a first voltage to produce a pumped voltage, wherein said pumped voltage is said voltage (v) supplied to said sector of non-volatile memory cells.

* * * * *